United States Patent [19]

Shank et al.

[11] Patent Number: 4,644,337
[45] Date of Patent: Feb. 17, 1987

[54] METHOD AND APPARATUS FOR CONTROLLING OSCILLOSCOPE DISPLAYED MENU SELECTION

[75] Inventors: Gordon W. Shank, Portland; Lloyd R. Bristol, Tigard; David H. Eby, Aloha, all of Oreg.; Jeffrey A. Kleck, Vancouver, Wash.

[73] Assignee: Tektronix, Inc., Beaverton, Oreg.

[21] Appl. No.: 665,692

[22] Filed: Oct. 29, 1984

[51] Int. Cl.$^4$ .............................................. G01R 13/22
[52] U.S. Cl. ................................. 340/709; 340/722; 324/121 R; 324/77 R
[58] Field of Search ............... 340/706, 709, 736, 740, 340/722, 753; 324/77 C, 77 CS, 88, 121 R, 121 E

[56] References Cited

U.S. PATENT DOCUMENTS

| | | | |
|---|---|---|---|
| 4,072,851 | 2/1978 | Rose | 324/121 R |
| 4,310,839 | 1/1982 | Schwerdt | 340/709 |
| 4,396,977 | 8/1983 | Slater et al. | 324/121 R |
| 4,544,885 | 10/1985 | Takahashi | 324/121 R |
| 4,578,640 | 3/1986 | Crooke et al. | 340/722 |

*Primary Examiner*—Gerald L. Brigance
*Attorney, Agent, or Firm*—John Smith-Hill; John P. Dellett

[57] ABSTRACT

An oscilloscope displays a menu consisting of set of field codes and one configuration code set grouped with each field code. Each field code represents an oscilloscope operating parameter while each configuration code represents an alternative oscilloscope operating mode associated with the operating parameter. A configuration cursor is displayed underlining one configuration code in each field thereby indicating the current operating configuration of the oscilloscope. The configuration of the oscilloscope may be changed by first rotating a first control knob, mounted on the oscilloscope front panel, to locate a field selection cursor under a selected field code and then by rotating a second control knob to move the associated configuration cursor under the desired configuration code. The configuration of each field may be altered by selective operation of the two control knobs in this manner. The menu is displayed only when the oscilloscope configuration is to be changed and the two control knobs are used for other oscilloscope control purposes when the menu is not displayed.

9 Claims, 12 Drawing Figures

DLY/EVTS     LOGIC-TRIGGER        A   DBE   76543210
57                                                                                     55

FIG. 4A                                   FIG. 4C

SWP<A  B>      START<A  WR>      DLY BY<B  WR>
57  55                    55                  55

SWP:TRG<A:A×B      A:A+B      A:WR     B:WR>
                                                             55

RADIX<BIN    OCT    HEX>    CLOCK<R   F   X>
57         55                                        55

METHOD AND APPARATUS FOR CONTROLLING OSCILLOSCOPE DISPLAYED MENU SELECTION

BACKGROUND OF THE INVENTION

The present invention relates to oscilloscopes of the type wherein operating parameters may be configured by making selections from a menu displayed on the oscilloscope screen and particularly to a method and apparatus for making the menu selections.

In order to reduce the number of controls needed on the oscilloscope front panel, oscilloscope configuration for a particular test or display is sometimes accomplished in part by allowing an operator to select and adjust oscilloscope operating parameters by making choices from a menu displayed on the oscilloscope screen. While use of a menu can reduce the number of front panel controls required, some control means must be provided to permit operator input to the menu. In the past such means have included special pushbuttons mounted on the oscilloscope, keyboards and similar devices.

SUMMARY OF THE INVENTION

According to one aspect of the present invention, a delayed sweep oscilloscope displays a menu consisting of set of field codes and several sets of configuration codes, one configuration code set grouped with each field code. Each field code represents an oscilloscope operating parameter while each configuration code represents an alternative oscilloscope mode within the associated operating parameter. A configuration cursor is displayed underlining one configuration code in each selection field thereby indicating the current operating configuration of the oscilloscope. The configuration of the oscilloscope may be changed by rotating a first control knob, mounted on the oscilloscope front panel, to locate a field selection cursor under a selected field code, and then rotating a second control knob to move the associated configuration cursor to the desired configuration code. The configuration of each field may be altered by operation of the two control knobs in this manner. Use of the two knobs permits rapid menu selection.

In another aspect of the present invention, the menu is displayed only when the oscilloscope configuration is to be changed and the two control knobs are used for other oscilloscope control purposes when the menu is not displayed, thereby eliminating the need for additional front panel controls required for menu selection.

It is accordingly an object of the present invention to provide a new and improved method and apparatus for rapidly selecting oscilloscope configuration options from a menu displayed on the oscilloscope screen.

It is a another object of the present invention to provide a new and improved method and apparatus for selecting oscilloscope configuration option parameters utilizing oscilloscope front panel control knobs otherwise used for other functions.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of a portion of a delayed sweep oscilloscope utilizing the present invention, FIG. 2 is a block diagram depicting a portion of the oscilloscope of FIG. 1 in more detail, FIG. 3 is a front view of a portion of a control panel which may be used in conjunction with the oscilloscope of FIG. 1, FIGS. 4A to 4E depict menus and parameters which may be displayed on the CRT screen of the oscilloscope of FIG. 1, and FIGS. 5A and 5B provide a flow chart for programming the microprocessor of FIG. 2 to provide for menu selection.

DETAILED DESCRIPTION

Figure 1:
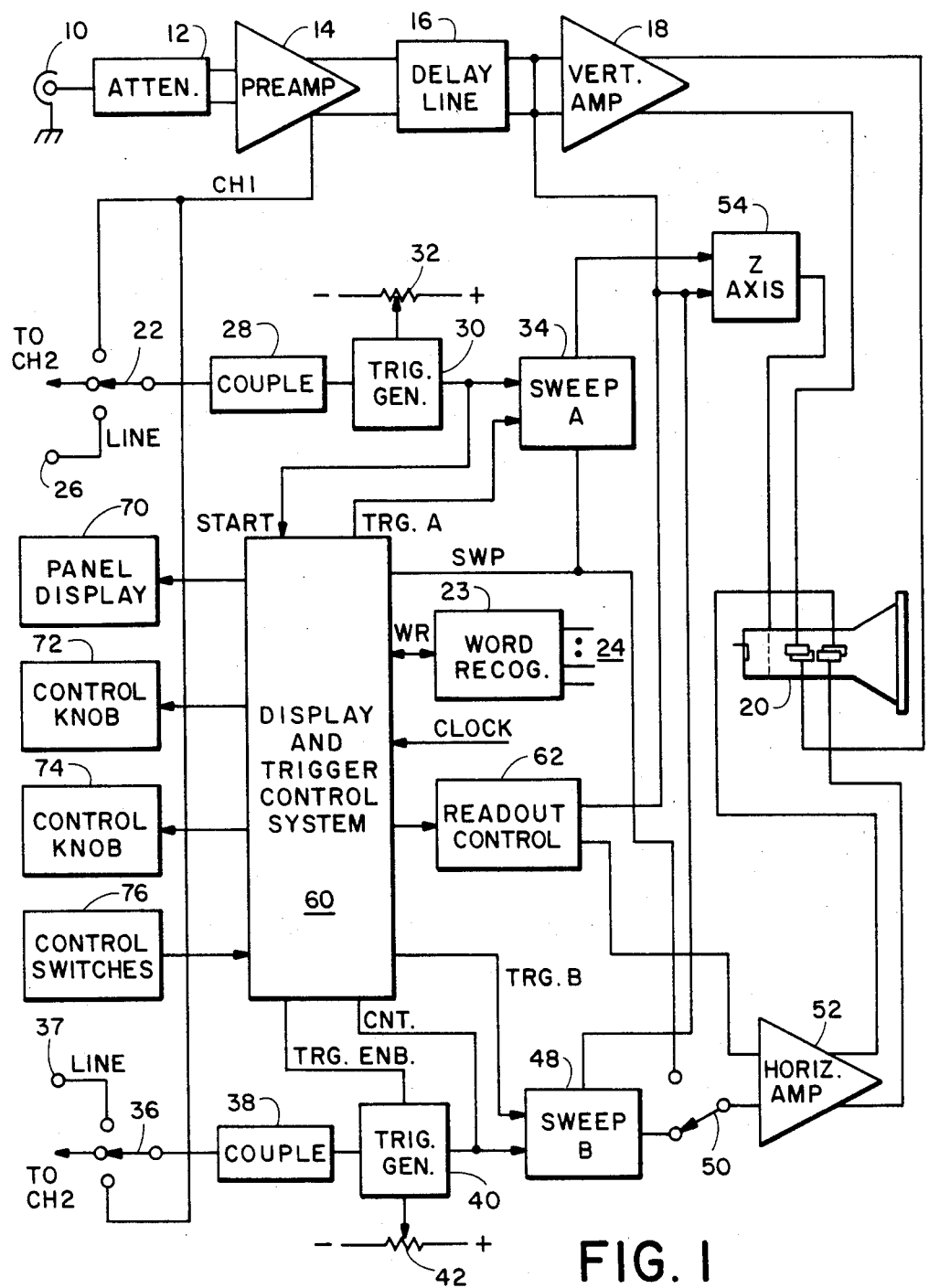

Referring to FIG. 1, the trigger and sweep circuits of an oscilloscope, illustrated in block diagram form, are adapted to provide delayed sweep operation controlled according to the present invention. Connected to input terminal 10 is an input signal to be observed which is ultimately applied to the vertical deflection plates of cathode-ray tube (CRT) 20 through controllable attenuator 12, preamplifier 14, delay line circuit 16 and vertical output amplifier 18. Trigger source switch 22 is used to select trigger signals from various sources including channels CH1 and CH2 and power line (LINE) trigger signal sources. The trigger signal for channel 1 is derived from vertical preamplifier 14. Although only one vertical channel is shown in this example, oscilloscopes typically include two or more vertical channels. For multi-channel oscilloscopes, trigger signals may be derived from each channel. The LINE trigger signal appears at terminal 26 for providing a triggering signal from any power line frequency related circuits.

The oscilloscope may also be equipped with word recognizer 23, a device which may be programmed to transmit a trigger signal (WR) to display and trigger control system 60 on receipt of a clock signal (CLOCK) whenever data on digital input lines 24 matches a predetermined word. Display and trigger control system 60 may be programmed to trigger either the A or B sweep circuits upon receipt of the trigger signal from the word recognizer.

The selected trigger signal from trigger source circuit 22 is applied to trigger coupling circuit 28 for selecting either AC or DC coupling methods. In the DC coupling method, all frequency components of a signal are coupled to the trigger-generator circuitry while in the AC coupling method signals are capacitively coupled to block low frequency signal (e.g. 60 Hz and below) components.

The A channel trigger signal, passed through coupling circuit 28, is then applied to trigger generator 30 for generating a fast trigger pulse by comparing the level of such trigger signal with a controllable trigger level from A TRIG LEVEL potentiometer 32. An output trigger signal from trigger generator 30 may be used to initiate A sweep generator 34 or may be used by display and trigger control system 60 to initiate delayed triggering functions discussed hereinbelow. A sweep signal from sweep generator 34 is applied to the horizontal deflection plates of CRT 20 by way of sweep mode selection switch 50 and horizontal output amplifier 52.

B sweep circuitry is similar to the aforementioned A sweep circuitry including a trigger source circuit 36, trigger coupling circuit 38, trigger generator 40, B trigger level control potentiometer 42, and B sweep generator 48. The B sweep signal from sweep generator 48 is also applied to the horizontal deflection plates of CRT 20 through switch 50 and horizontal amplifier 52.

Although not shown in FIG. 1, the A trigger generator circuit 30 is designed to operate in either automatic level (AUTO LEVEL), automatic (AUTO), or normal (NORM). AUTO LVL is a trigger mode wherein trigger level is automatically established on a triggering signal and free runs the sweep in the absence of a triggering signal. In the AUTO mode the sweep free runs in the absence of a triggering signal and the trigger level is manually adjusted using TRIG LEVEL potentiometer 42. In the NORM mode sweep is triggered and runs when a triggering signal compatible with the setting on potentiometer 42 is applied.

The sweep circuits may operate in either of two delaying modes (delay-by-time or delay-by-events) while in either of two triggering modes (run-after-delay or trigger-after-delay). In the delay-by-time, run-after-delay mode, A sweep circuit 34 produces a ramp-type output signal (SWP) upon initiation by a trigger signal (TRG A) from display and trigger control circuit 60 upon receipt of a START signal from trigger generator 30. When the SWP signal reaches a predetermined level, control circuit 60 transmits a TRG B signal to B sweep generator 48 initiating the B sweep. Alternatively, in the delay-by-time, trigger-after-delay mode, when the SWP signal reaches the predetermined level, control circuit 60 transmits a TRG ENB signal enabling B trigger generator 40. The B sweep is then initiated on the next trigger pulse generated by trigger generator 40.

In a delay-by-events mode, either the A or the B sweep may be delayed by a predetermined number of B trigger events following receipt of a starting signal. The starting signal may be the A trigger signal (START) from trigger generator 30. Alternatively, the starting signal may be a trigger signal (WR) from the word recognizer 23. The START or the WR signal is transmitted to control circuit 60 which begins counting B trigger events received from the B trigger generator 40 over the CNT signal line from trigger generator 40. When the B trigger event count reaches a predetermined limit, control circuit 60 initiates either a TRIG A signal to A sweep generator 34 or a TRIG B signal to B sweep generator 48, depending on the sweep to be delayed, to start the delayed sweep. The TRIG A or TRIG B signals starting the A or B sweeps may also be delayed until control circuit 60 receives a selected number of word recognizer 23 WR signals following occurrence of a START trigger event.

The A and B sweeps may also operate in a logic trigger mode where the A sweep may be triggered without delay by various logical combinations of signals from the A and B triggers and where the A or the B sweeps may be triggered by control system 60 upon receipt of a WR signal from the word recognizer 23.

A number of oscilloscope operating parameters including the delay-by-events configuration and count limits, the word recognizer configuration, the word to be recognized, and the logic trigger configuration may be selectively displayed on the CRT 20 screen by control circuit 60 acting through readout control circuit 62 which provides inputs to vertical amplifier 18, horizontal amplifier 52 and Z axis amplifier 54 to generate the display in a well known manner. By operating control knobs 72 and 74, mechanically linked to control system 60, an operator may adjust the count limit and word recognizer parameters as described in more detail hereinbelow.

Figure 2:
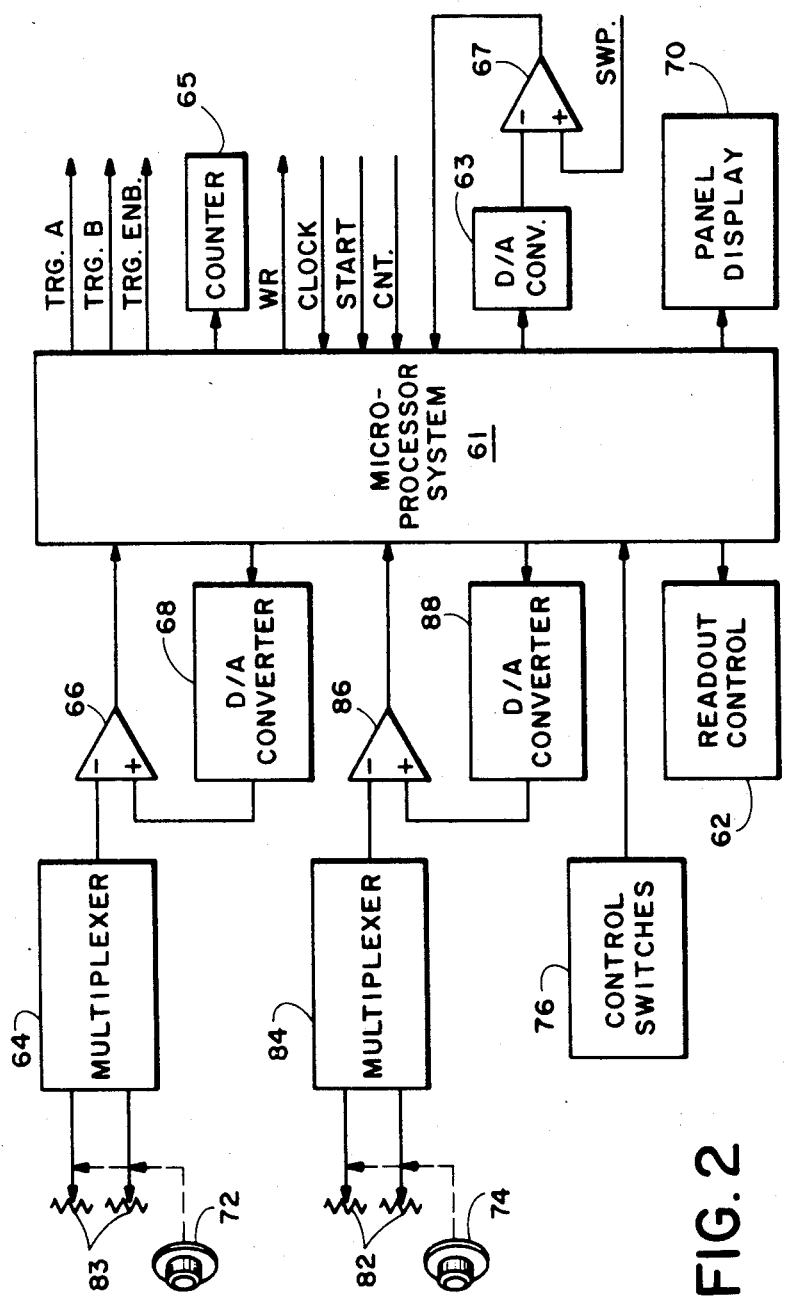

A particular embodiment of control system 60 is depicted in block diagram form in FIG. 2. Control knobs 72 and 74 operate dual pots 83 and 82 which are of the type providing a continuously varying analog voltage signals through 360 degrees of knob rotation. The outputs of pots 83 are coupled to multiplexer 64 and then to the inverting input of comparator 66. An analog signal from digital-to-analog (D/A) converter 68, proportional to a digital input from microprocessor system 61, is connected to the noninverting input of comparator 66. The output of comparator 66 is applied to microprocessor 61. The microprocessor performs a successive approximation to digitize pot rotation by applying varying digital quantities to D/A converter 68 to determine the point at which comparator 66 changes state, the movement rather than the relative position of the pots being used to control oscilloscope functions. Such digitizing methods are well known in the art and are not further detailed herein. Microprocessor 61 digitizes the rotation of pots 82 in the same way, with pots 82 connected to multiplexer 84, providing the inverting input to comparator 86, and with D/A converter 88, controlled by microprocessor 61, providing the noninverting input.

Also a part of control system 60 is delay-by-events counter 65, utilized in the delay-by-events mode to count trigger pulses from the B sweep generator over the CNT line upon receipt of a starting signal from microprocessor 61 or to count WR signals from the word recognizer. When the count reaches a limit set by microprocessor 61, counter 65 transmits an indicating TRG signal to the microprocessor system which then generates a TRG A, TRG B or a TRG ENB signal, to initiate the selected delayed sweep.

Another part of control system 60 is delay-by-time comparator 67, utilized in the delay-by-time mode to generate a TRG signal when the SWP signal voltage exceeds the signal voltage from D/A converter 63 connected to the inverting input of the comparator. The output signal of converter 63 is proportional to selected input data supplied to the converter from microprocessor 61. When microprocessor system 61 receives the TRG signal from comparator 67 it generates the appropriate TRG B or TRG ENB signal depending on the selected mode and sweep channel.

Figures 3, 4B, 4D, 4E:
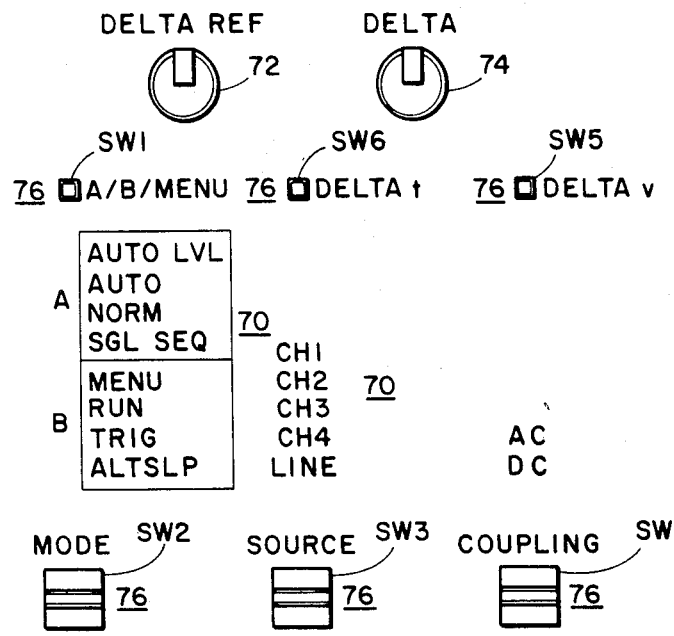

FIG. 3 depicts a portion of the controls and indicators of the front panel of a four channel oscilloscope similar to the two channel oscilloscope of FIG. 1. Controls and indicators include indicating lights 70, A/B-/MENU, MODE, SOURCE, COUPLING, DELTA v and DELTA t control switches 76, DELTA REF control knob 72 and DELTA control knob 74.

A/B/Menu switch SW1 directs MODE, SOURCE, COUPLING AND LEVEL controls to either the A trigger or the B trigger. Up/down trigger MODE selection switch SW2 is pushed up or down to select any of AUTO LVL, AUTO, NORM or SGL SEQ modes for the A sweep circuit when in the A select mode, or to select MENU, RUN AFTER DELAY or TRIG AFTER DELAY when in the B select mode. When in the A trigger select mode, the A trigger mode can be changed by raising or depressing mode select switch SW2. When in the B trigger select mode, operation of SW1 changes the B trigger mode. The select mode may be changed from the A to the B modes by pressing SW1 once and to a menu mode by depressing SW1 once again. Depressing SW1 a third time restores the A select mode.

The menu mode is indicated by the MENU indicating lamp 76 and may be entered either by using the A/B-/MENU switch SW1 or by using MODE switch SW2 when in the B select mode. In the menu mode, menus for selecting various trigger operating parameters are displayed on the oscilloscope CRT as discussed in more detail hereinbelow.

At the bottom center of the panel, SOURCE switch SW3 is an up/down lever switch for selecting the trigger signal source for either the A or the B trigger with the selected source indicated by source indicating lamps CH1, CH2, CH3, CH4 or LINE directly above the switch. Assuming now that the CH1 trigger source is selected in a certain instance, the CH1 indicator lamp is lit. CH2, CH3 or CH4 may then be selected by pushing down the SW3 switch from one to three times while the LINE source may be selected by pushing down the SW3 switch four times. On the other hand, the trigger source is switched sequentially from LINE to CH1 by pushing up on switch SW3. By continuously holding the switch up or down the selection is stepped repeatedly.

In a similar fashion up/down COUPLING switch SW4 may be operated to select the method of coupling the triggering signal to the A and B trigger generator circuitry from between the DC and AC modes.

DELTA v switch SW5 is a momentary pushbutton which activates a "delta volts" measurement function when pressed. When the delta volts function is activated, the CRT displays two horizontal cursor lines superimposed on a displayed A sweep waveform along with a digital readout indicating the equivalent voltage represented by the separation of the two cursors. The position of one cursor is set by DELTA REF control knob 72 while the position of the other cursor is controlled by DELTA control knob 74. Similarly DELTA t switch SW6 activates a "delta time" measurement function when pressed wherein two vertical cursor lines are displayed on the CRT screen along with data representing the time difference between the two cursors. The position of one cursor is controlled by the DELTA REF knob 72 while the position of the second cursor is controlled by the DELTA knob 74.

The DELTA REF and DELTA knobs 72 and 74 may also be used to provide operator control over menu selections when a menu is displayed. Referring to FIG. 4A, upon entering the menu mode, a Main Menu is displayed in the upper right hand corner of CRT 20 consisting of a pair of menu function codes (DLY-/EVTS and LOGIC-TRIG) with a field cursor 57 underlining the selected menu function. The cursor may be moved to the left or the right to select the desired function by rotating clockwise or counterclockwise either DELTA REF knob 72 or DELTA knob 74 of FIG. 3. When the appropriate function code is selected trigger mode switch SW2 is pushed up to display a configuration menu for the selected function.

When the delay-by-events (DLY/EVTS) function is selected, and mode switch SW2 is pushed up, a Delay-by-Events Configure Menu (FIG. 4B) replaces the Main Menu on the screen. Three bracketed selection fields, each identified by a field code (SWP, START and DLY BY) are displayed with each bracketed field containing a set of configuration codes. Each field code represents an oscilloscope operating parameter while each configuration code represents an alternative oscilloscope configuration option within the associated field parameter. One configuration code within each field is underlined by a configuration cursor 55 indicating the currently selected configuration option.

The SWP field code represents the sweep delay parameter and the SWP field contains configuration option codes A and B indicating the sweeps which may be delayed, either the A sweep or the B sweep. The currently selected delayed sweep is indicated by a configuration cursor 55 under the A configuration code. To modify the oscilloscope configuration to permit a delayed B sweep, the SWP field is first selected for modification by rotating knob 72 counterclockwise to move field cursor 57 from under the START code to under the SWP field code. With the SWP field selected, the sweep to be delayed is selected by rotating control knob 74 clockwise to move configuration cursor 55 from A to B or counterclockwise to move from B to A.

Similarly the START field may be configured by rotating knob 72 clockwise to cause the field cursor 57 to underline the START symbol, and then by operating knob 74 to move the associated configuration cursor 55 under the event which will start the delay count, either the word recognizer (WR) or the A trigger generator (A). If the B Sweep is selected to be delayed, the START field defaults to the A trigger event, cursor 55 positioning automatically under the A configuration code. Conversely, if the word recognizer is selected as the START event, the SWP field defaults to A. If the DLY BY field is selected, using knob 72 to underline the DLY BY symbol with the field cursor, the delaying event counted to initiate the sweep may be selected from the DLY BY field using control knob 74 to control the associated field cursor. Either the B trigger event (B) or the word recognizer event (WR) can be selected. Thus the current delayed sweep starting event, and delaying event may be determined by observing the current position of the configuration cursors of the Delay-by-Events Configuration Menu.

When B sweep delay-by-events is selected and mode select switch SW2 is pushed up, the menu is removed from the screen and the number of occurrences (the count limit) of the delaying event necessary to initiate the sweep is displayed at the top of the CRT screen along with a letter (A or B) indicating the sweep being delayed by events. An example of the display is shown in FIG. 4C. The count limit may then be altered by appropriate means.

Referring again to FIG. 4A, if the LOGIC-TRIG function is selected from the Main Menu, and the trigger MODE switch is pushed up, the Logic-Trigger-Configure Menu of FIG. 4D is displayed. The sweep (SWP) to be triggered and the source (TRIG) of the trigger are both selected from this menu by using either control knob 72 or control knob 74 to move a configuration cursor to underline the appropriate selection code. The configuration selections are A:A×B (the A sweep is triggered when both the A and B trigger generators produce a trigger signal at the same time), A:A+B (the A sweep is triggered when either an A or a B trigger generator produces a trigger signal), A:WR (the A sweep is triggered when the Word Recognizer detects a selected word), or B:WR (the B sweep is triggered when the word recognizer detects a selected word). When the logic-trigger configuration is correct, the trigger MODE switch SW2 is pushed up to activate the function selected. However if the word recognizer function (WR) is selected a Word-Recognizer-Configure Menu is displayed as shown in FIG. 4E.

Referring now to FIG. 4E, the Word-Recognizer-Configuration menu is used to set the word recognizer's RADIX and CLOCK parameters. The field to be configured (RADIX or CLOCK) is selected by operating DELTA REF knob 72 to locate a field cursor under the field selected. With the field selected, DELTA control knob 74 is operated to select the appropriate configuration choice by controlling an associated configuration cursor. In the RADIX field, the word to be recognized may be configured as either binary (BIN), octal (OCT) or hexadecimal (HEX) while in the CLOCK field the clock edge used to acquire data in the word recognizer may be configured as either a rising edge (R), a falling edge (F) or neither (X), as when the word recognizer is to operate in an asychronous mode. With the word recognizer configured as desired, the trigger MODE switch SW2 may be pressed up again to activate the selected function and to deactivate the menu mode.

When the oscilloscope utilizes the word recognizer as a trigger or a delaying mechanism, the status of the word recognizer is displayed in the format shown in FIG. 4F where "t" is the trigger selected (A or B); "c" is the clock mode (R,F or X), "q" is a qualifier bit (0 or 1) and "word" is the value of the data to be recognized by the word recognizer displayed in the selected radix - binary, octal or hexadecimal. Suitable means may be used to reconfigure the word recognizer word. Thus it is seen that the DELTA REF control knob 72 and the DELTA control knob 74 are used to control a number of functions including placement of the delta voltage and delta time cursors, and menu selection of trigger function (DLY/EVTS or LOGIC-TRIG), and trigger function configuration. In the menu mode, knob 72 controls field selection while knob 74 controls configuration selection.

Figure 5A:
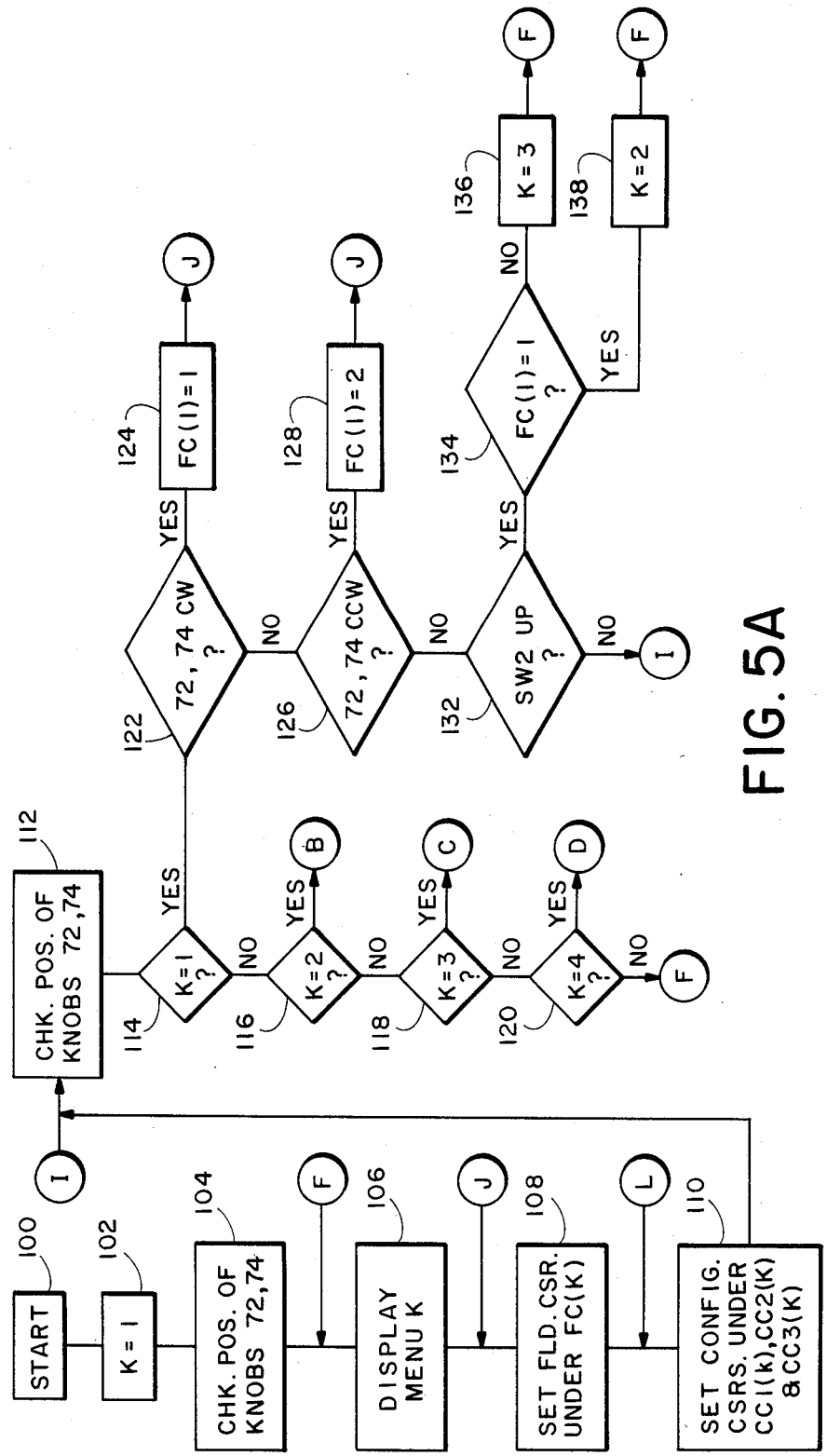
Figure 5B:
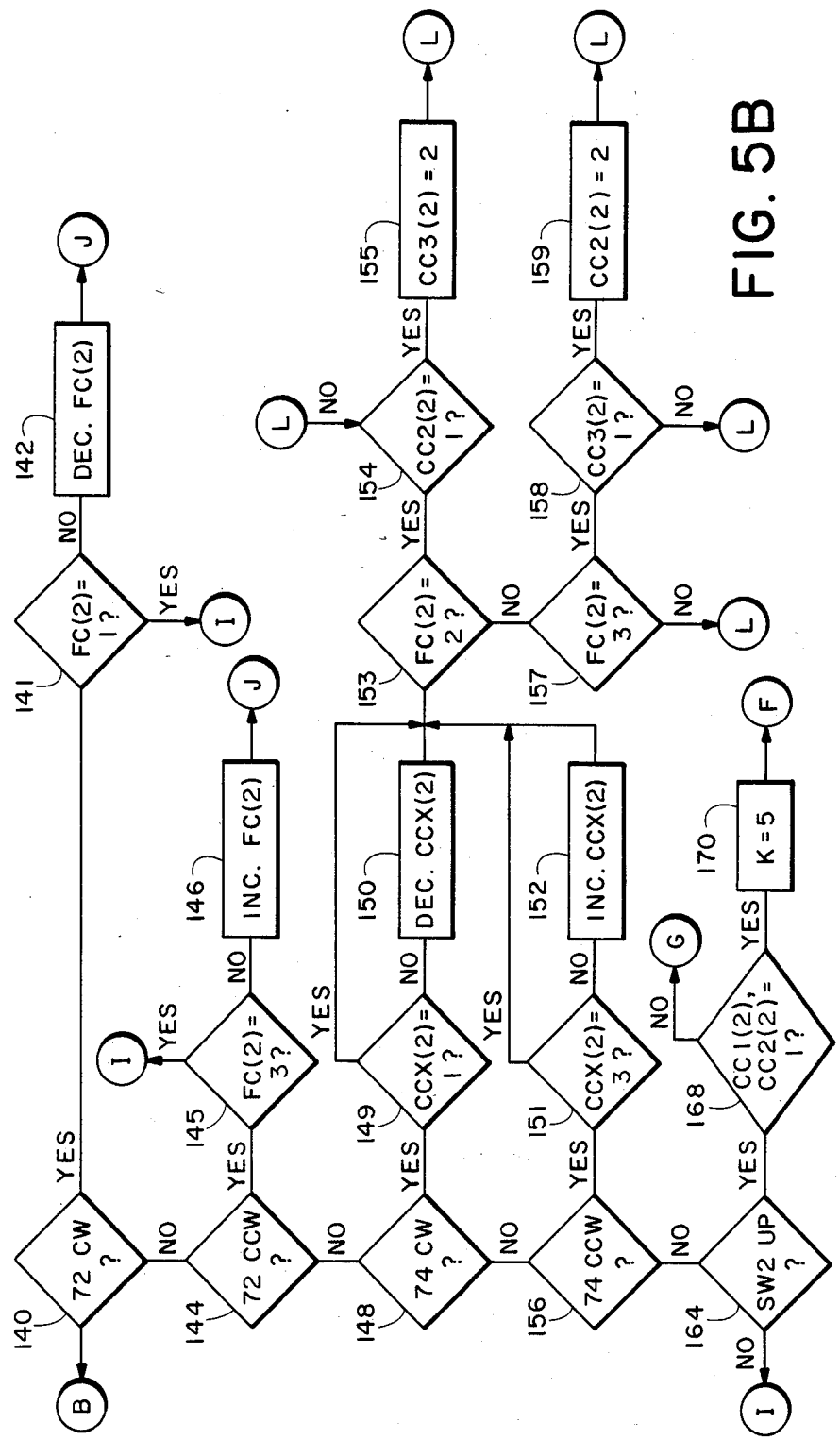
Figures 5C, 5D:
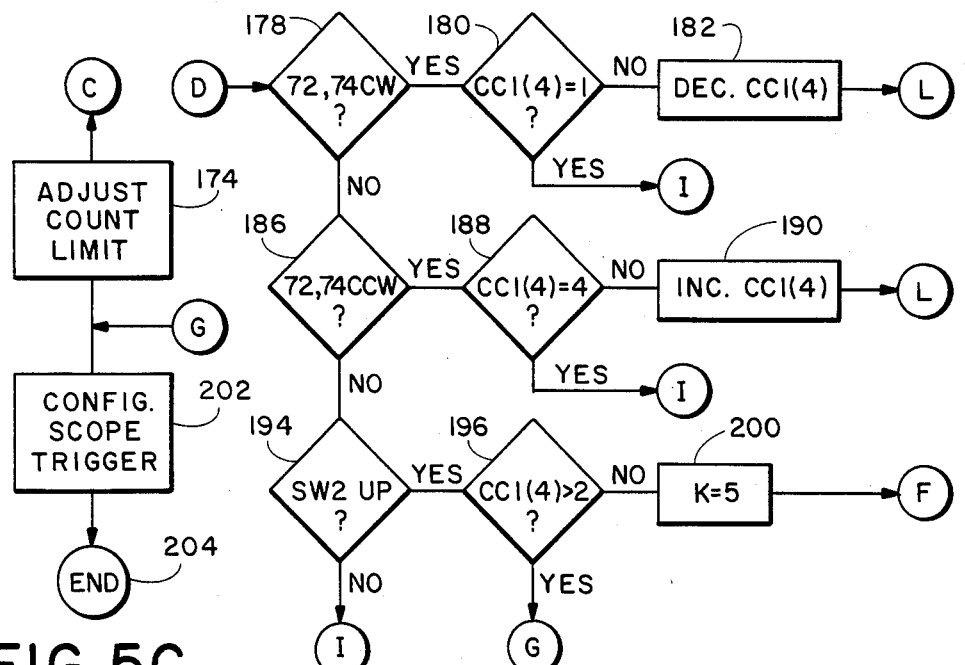
Figure 5E:
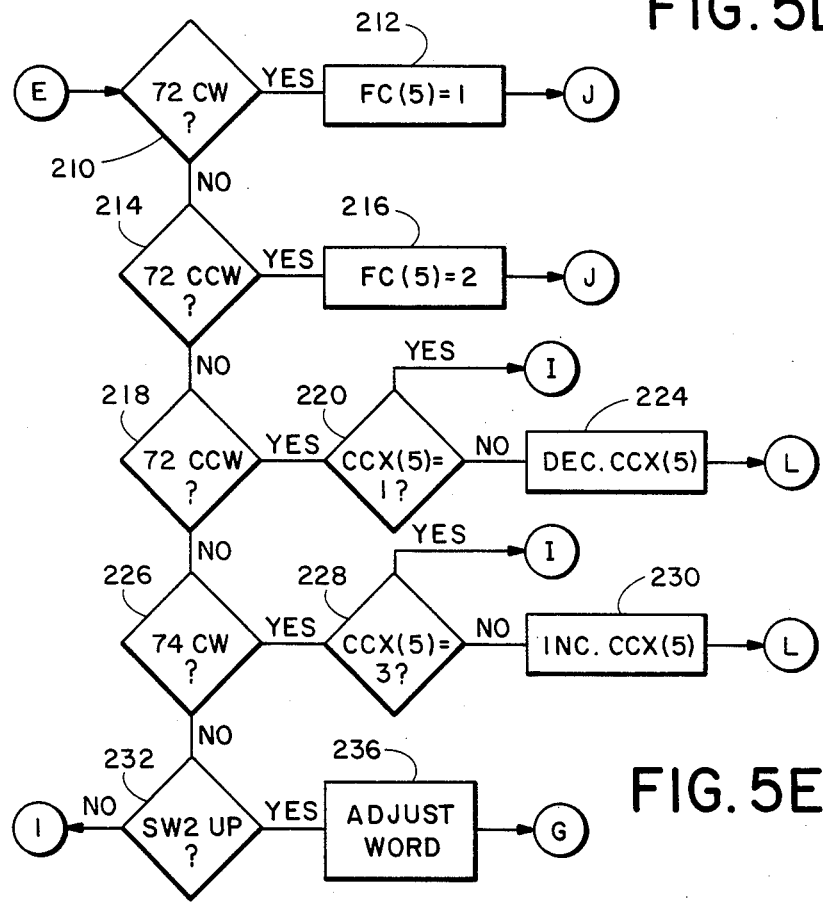

An algorithm which may be used to program microprocessor 61 to control the menu selection process is shown in flow chart form in FIG. 5A and 5B. The algorithm begins in block 100 when the oscilloscope enters the menu mode. In block 102 the variable K is set to 1. K represents the menu number with the Main Menu being menu number 1, the Delay-by-Events Configure Menu being number 2, the count limit number display being menu number 3, the Logic-Trigger Configuration Menu being menu 4, and the Word Recognizer Configure Menu being number 5.

Next, in block 104, microprocessor 61 checks the current angular positions of DELTA REF control knob 72 and DELTA control knob 74 using a successive approximation method and stores the position information for later use. Moving to block 106, the Kth menu, initially menu number 1, the Main Menu of FIG. 4A is displayed on the oscilloscope screen. In block 108 the field cursor is displayed under the field code indicated by the value of variable FC(K). In the Main Menu, there are two field codes, DLY/EVTS (indicated by FC(1)=2) and LOGIC-TRIG (indicated by FC(1)=1). When the oscilloscope is started, FC(1) takes on a default value of 1, such that initially block 108 sets the field cursor under the LOGIC-TRIGGER field code.

Next, in block 110, up to three configuration cursors may be displayed on the screen under selected configuration codes indicated by the variables CC1(K), CC2(K) and CC3(K). In the Main Menu there are no configuration codes, so CC1(1), CC2(1) and CC3(1) are initialized to 0 when the oscilloscope is first turned on, and none of the configuration cursors are to be displayed while the Main Menu is on the screen. Once a menu is displayed on the screen, an operator may move the field and configuration cursors using control knobs 72 and 74. In block 110 the position of the knobs are checked again to see if either knob 72 or 74 has been moved since the last check and to determine the direction of such movement, clockwise or counterclockwise. If the Main Menu is displayed, K is equal to 1 and block 114 diverts program flow to block 122. If either knob 72 or knob 74 has been moved in a clockwise direction, then block 122 directs operation to block 124 where FC(1) is set to 1 to indicate that the operator has selected the LOGIC-TRIGGER field. Program flow then returns to block 108 where the field cursor is moved under the LOGIC-TRIGGER field code since FC(K) is now equal to 1.

Referring again to block 122, if neither control knob has moved in a clockwise direction since last checked, then program flow is directed to block 126. If one of the knobs has been moved in counterclockwise direction then block 126 leads to block 128 where the value of FC(1) is set to 2 and then back to block 108 where the field cursor is moved under the DLY/EVTS field. If the knobs have remained stationary since last checked then block 126 directs program flow to block 132 where the position of MODE switch SW2 is checked. If the MODE switch is not up then the program reverts back to block 112 and nothing on the screen is changed. However if the MODE switch has been pushed up, block 132 directs the program to block 134 and if FC(1)=1, indicating that the DLY/EVTS field has been selected, block 134 further directs the program to block 138 where the K variable is changed to 2 and then back to block 106 where the DELAY-by-Events Configuration Menu (K=2) of FIG. 4B is called to replace the Main Menu. Alternatively, in block 134, if FC(1)=2, then the LOGIC-TRIGGER field has been selected and program flow is directed to block 136 where K is set to 3 and then to block 106 where the LOGIC-TRIGGER Configuration Menu (K=3) replaces the Main Menu on the screen.

If the DLY-by-Events Configuration Menu (K=2) is currently on the screen, then block 114 directs program flow to block 116 which further directs the program to block 140. The three fields in the DELAY-by-Events Configuration Menu are referenced by the value of FC(2) with the field on the left (SWP) having FC(2) equal to 3, the center field (START) having FC(2) equal to 2, and the field on the right (DLY BY) having FC(2) equal to 1. If the DELTA REF knob 72 has been turned in the clockwise direction, block 140 passes control to block 141 where the value of FC(2) is checked to see if it is 1, indicating that the cursor is already on the rightmost field. If so, then program flow returns to block 112 without changing the cursor position. If FC(2) is not 1 then block 141 directs operation to block 142 where the value of FC(2) is decremented and then to block 108 where the field cursor is moved to the right.

If control knob 72 has been turned counterclockwise, then block 140 directs flow to block 144 which further directs the program to block 145 where the value of FC(2) is checked to see if it is 3 indicating that the field cursor is already on the leftmost field. If it is, program flow is directed back to block 112 and the position of the cursor remains unchanged. If FC(2) is not 3, block 145 passes control to block 146 where the value of FC(2) is incremented and then to block 108 where the field cursor is moved one position to the left.

If, while in menu 2, knob 72 is not moved, block 144 directs flow to block 148. If knob 74 has been moved in a clockwise direction, block 148 directs program flow to block 149 where the value of the configuration cursor variable CCX(2) (meaning CC1(2), CC2(2) or CC3(2) depending on which field is currently selected) is checked to see if it is 1 indicating that the configuration cursor within the currently selected field is already on the rightmost configuration code. If not, block 149 directs program flow to block 150 where CCX(2) is decremented by 1. Flow then passes to block 153. If CCX(2) is already 1 then block 149 passes the program directly to block 153 without changing the cursor variable.

If knob 72 has been moved in a counterclockwise direction, then program flow passes from block 149 to block 156 and then to block 151 where the value of CCX(2) is compared to 3 to see if the configuration cursor is already under the leftmost configuration code. If so, program flow is directed to block 153 without changing the value of the variable. But if the cursor is not under the leftmost configuration code, block 151 passes program operation to block 152 which increments the CCX(2) variable and then passes operation on to block 153.

In block 153, if the currently selected field is the START field (FC(2)=2) then program operation flows to block 154. If the newly selected configuration code in the START field is WR (CC2(2)=1) then block 154 directs program flow to block 155 where CC3(2) is set to 2 so that the SWP field configuration cursor will automatically default to the A codes as described previously and the program flow reverts to block 110 to relocate the configuration cursors. Similarly, if the currently selected field is the SWP field (FC(2)=3) then block 153 directs program flow to block 157 and then to block 158. If the B sweep (CC3(2)=1) has been selected in the SWP field, then block 158 directs operation to block 159 where the START field is automatically defaulted to the A configuration code (CC2(2)=2) and then to block 110 for cursor relocation. If the DLY BY field has been selected (FC(2)=1), then block 157 directs program operation back to block 110 where the configuration cursor is appropriately adjusted. Similarly if CC2(2) is not equal to 1 in block 154 or if CC3(3) is equal to 1 in block 158, program flow is redirected back to block 110 for appropriate cursor relocation.

If neither knob 72 nor knob 74 has been moved, then blocks 148 and 156 pass program operation to block 164 where the condition of MODE switch SW2 is checked. If the switch is not in the up position, then the program reverts back to block 112 to check again for control knob movement. If, however, switch SW2 has been raised by the operator, indicating he wishes to exit the menu, block 164 directs program flow to block 168 where the values of CC1(2) and CC2(2) are tested. If either CC1(2) or CC2(2) is equal to 1, indicating that the word recognizer is to be used, then block 168 passes control to block 170 where K is set equal to 5 so that as program control passes from block 170 to block 106 the Word Recognizer Configuration Menu (k=5) is displayed, replacing the currently displayed menu. However, if the word recognizer is not being used, block 168 directs the program to block 202 where the oscilloscope is reconfigured according to the currently selected configuration parameters and the menu program is exited.

Referring back to block 114, if the Delay-by-Events Configuration Menu (seen in FIG. 4C) is displayed then program flow passes through block 114 and 116 to 118 where, because K equals 3, flow is diverted to block 174 in which a subroutine is called allowing the operator to modify the delay by events number displayed. Thereafter control passes to block 202 where the oscilloscope is reconfigured according to the selected configuration parameters and the menu mode is ended.

If the Word Recognizer Configuration Menu, of FIG. 4D is being displayed (K=4), the blocks 114, 116, 118 and 120 pass program control to block 178. This block directs program flow to block 180 if either knob 72 or 74 have been turned clockwise. If CC1(4) is not 1, indicating that the configuration cursor is already under the rightmost configuration code (B:WR), then block 180 passes control to block 182 where CC1(4) is decremented and then back to block 110 to reset the cursor position. Otherwise block 180 passes control to block 112 without changing the cursor parameter. If knob 72 or knob 74 has been moved counterclockwise, then blocks 178 and 186 pass control to block 188 where the value of CC1(4) is checked. If CC1(4) is not already 4 (indicating the selection cursor is already at its leftmost position under code A:AXB) then control passes from block 188 to block 190 where the value of the cursor parameter is incremented and then to block 110 where the cursor is moved to the left. Otherwise, block 188 diverts program flow to block 112 and the cursor position remains unchanged.

If neither control knob has been moved, then blocks 178 and 186 pass control to block 192 where the position of the MODE switch SW2 is checked. If the switch is not in the up position, block 194 sends the program to block 112. If the switch is pushed up, block 194 sends the program to block 196 where the value of CC1(4) is checked. If it is greater than 2, the word recognizer is not to be used and program flow is directed to blocks 202 and 204 to reconfigure the oscilloscope and exit the menu mode. If CC1(4) is 1 or 2 then the either A:WR or B:WR mode has been selected and block 196 directs the program to block 200 where K is set equal to 5 and then to block 106 where the Word Recognizer Configuration Menu (seen in FIG. 4E) is put on the screen.

With the Word Recognizer Configuration Menu on the screen, blocks 114, 116, 118 and 120 pass operation to block 210 where, if knob 72 has been turned clockwise operation passes to block 212. In this block FC(5) is set to 1 and the program returns to block 108 to put the field cursor under the CLOCK field code if not already there. If knob 72 is turned counterclockwise then blocks 214 and 218 pass control to block 216 where FC(5) is set to 2 and then on to block 108 where the field cursor is placed under the RADIX field code.

If knob 72 is unchanged, blocks 210 and 214 direct program flow to block 218 where, if knob 74 has been turned clockwise, flow is further directed to block 220. Block 220 checks the value of CCX(5) (where X is 1 if FC(5)=1 or 2 if FC(5)=2). If CCX(5) is equal to 1 then the configuration cursor is already on its rightmost field code and block 220 passes program control to block 112 without changing the cursor position. If CCX(5) is other than 1, block 220 directs control to block 224 where the value of CCX(5) is decremented by 1 and then to block 108 where the configuration cursor in the selected field is moved under the next code to the right.

If knob 74 has been turned counterclockwise, flow is directed from block 218 through block 226 to block 228 where the value of CCX(5) is checked. If CCX(5)=3 then the configuration cursor of the selected field is under the leftmost configuration code and block 228 directs program flow back to block 112, the position of the cursor remaining unchanged. However if the configuration cursor in not under the leftmost code, block 228 passes control to block 230 where the value of CCX(5) is incremented and then to block 108 where the configuration cursor is moved to the left.

If neither the DELTA REF knob 72 nor the DELTA knob 74 has been moved, program flow passes from block 226 to block 232 where the position of SW2 is checked. If SW 2 is not up then the program reverts to block 112. However if the switch is up, block 232 directs flow to block 236 where a subroutine is called allowing the operator to select the value of the word to be recognized by the word recognizer. Then program operation passes to block 202 where the oscilloscope is reconfigured according to the currently selected configuration parameters and the menu selection program ends in block 204.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for modifying the operating configuration of an oscilloscope, the method comprising the steps of:
    (a) displaying a menu on a screen of said oscilloscope, the menu comprising a set of field codes along with one set of configuration codes associated with each displayed field code, each field code representing a variable oscilloscope operating parameter and each configuration code representing an alternately selectable operating mode within the operating parameter,
    (b) rotating a first control knob to select a field code from among said set of displayed field codes, such selected field code being visibly distinguished from all others on the screen as having been selected, and
    (c) rotating a second control knob to select one configuration code of the set of configuration codes associated with the selected field code, such selected configuration code being visibly distinguished from all other configuration codes associated with the selected field code as having been selected.

2. A method as in claim 1 wherein the oscilloscope is a delayed sweep oscilloscope having more than one alternatively delayable sweep and wherein one operating parameter being configured comprises the sweep to be delayed.

3. A method as in claim 1 wherein rotation of the first knob controls the movement of a cursor on the oscilloscope screen, field code selection being indicated by the position of the cursor with respect to a selected field code.

4. A method as in claim 1 wherein rotation of the second knob controls the movement of a cursor on the oscilloscope screen, configuration code selection being indicated by the position of the cursor with respect to a selected configuration code.

5. An apparatus for modifying the operating configuration of an oscilloscope comprising:
    means to display a menu on a screen of said oscilloscope, the menu comprising a set of alternately selectable field codes along with one set of configuration codes associated with each displayed field code, each field code representing a variable oscilloscope operating parameter and each associated configuration code representing an alternately selectable operating mode within the operating parameter,
    a first and a second control knob,
    means, responsive to the rotation of the first control knob, to alter selection of a field code as the first control knob is rotated, and
    means, responsive to the rotation of the second control knob, to alter the selection of a configuration code associated with the selected field code as the second control knob is rotated.

6. An apparatus as in claim 5 wherein said means responsive to the rotation of the first control knob comprises:
    means for producing a digital signal,
    first means for producing a first analog voltage output signal varying with said digital signal,
    second means for producing a second analog voltage output signal varying with the rotation of said first control knob, and
    a comparator coupled to produce an output signal which changes state when a voltage difference between the first and second analog voltage output signals changes sign.

7. An apparatus as in claim 5 wherein the first and second control knobs may be utilized to control another function of the oscilloscope when the menu is not being displayed.

8. An apparatus as in claim 7 wherein said another function of the oscilloscope comprises control of the movement of cursors on the oscilloscope screen used in the measurement of the time difference between two points on a displayed waveform.

9. An apparatus as in claim 7 wherein said another function of the oscilloscope comprises control of the movement of cursors on the oscilloscope screen used in the measurement of the voltage difference between two points on a displayed waveform.

* * * * *